US010553662B2

(12) United States Patent
Lee et al.

(10) Patent No.: US 10,553,662 B2
(45) Date of Patent: Feb. 4, 2020

(54) LIGHT EMITTING DISPLAY DEVICE INCLUDING STRUCTURE FOR REDUCING REFLECTION

(71) Applicant: SAMSUNG DISPLAY CO., LTD., Yongin-si, Gyeonggi-do (KR)

(72) Inventors: Hyeonbum Lee, Hwaseong-si (KR); Jeongwon Kim, Seoul (KR); Hyoeng-ki Kim, Suwon-si (KR); Kwangwoo Park, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/165,647

(22) Filed: Oct. 19, 2018

(65) Prior Publication Data

US 2019/0165074 A1    May 30, 2019

(30) Foreign Application Priority Data

Nov. 30, 2017    (KR) .......................... 10-2017-0162951

(51) Int. Cl.
*H01L 27/32* (2006.01)
*H01L 51/52* (2006.01)
(52) U.S. Cl.
CPC ........ *H01L 27/3272* (2013.01); *H01L 27/323* (2013.01); *H01L 27/3246* (2013.01); *H01L 51/524* (2013.01); *H01L 51/5281* (2013.01)
(58) Field of Classification Search
None
See application file for complete search history.

(56) References Cited

U.S. PATENT DOCUMENTS

| 9,905,620 | B2 | 2/2018 | Kim et al. | |
|---|---|---|---|---|
| 2001/0004190 | A1* | 6/2001 | Nishi | H01L 27/3244 313/506 |
| 2008/0138657 | A1* | 6/2008 | Lee | H01L 51/5281 428/690 |
| 2008/0150421 | A1* | 6/2008 | Takata | H01L 27/3244 313/504 |
| 2010/0148192 | A1* | 6/2010 | Jung | H01L 27/3246 257/88 |
| 2014/0191203 | A1* | 7/2014 | Son | H01L 51/5284 257/40 |
| 2015/0028294 | A1* | 1/2015 | Kim | H01L 27/322 257/40 |

(Continued)

FOREIGN PATENT DOCUMENTS

| KR | 10-2016-0106825 | 9/2016 |
|---|---|---|
| KR | 10-1750428 | 6/2017 |
| KR | 10-2017-0109184 | 9/2017 |

*Primary Examiner* — Grant S Withers
(74) *Attorney, Agent, or Firm* — F. Chau & Associates, LLC (57) ABSTRACT

A light emitting display device includes a substrate and a switching element disposed on the substrate. A pixel electrode is disposed on the substrate and is connected to the switching element. A pixel defining layer is disposed on the pixel electrode. The pixel defining layer defines a pixel area of the substrate. A light emitting layer is disposed on the pixel electrode. A common electrode is disposed on the light emitting layer and the pixel defining layer. A sealing layer is disposed on the common electrode. A first light blocking layer is disposed between the pixel defining layer and the sealing layer.

20 Claims, 6 Drawing Sheets

(56) References Cited

U.S. PATENT DOCUMENTS

| | | | |
|---|---|---|---|
| 2015/0187857 A1* | 7/2015 | Negishi | H01L 27/3272 |
| | | | 257/40 |
| 2015/0200211 A1* | 7/2015 | Hong | H01L 27/1248 |
| | | | 349/43 |
| 2017/0090634 A1 | 3/2017 | Yang et al. | |
| 2017/0147117 A1* | 5/2017 | Song | G06F 3/0412 |
| 2017/0271429 A1 | 9/2017 | Kim et al. | |
| 2017/0279084 A1* | 9/2017 | Sakamoto | H01L 27/322 |

* cited by examiner

LIGHT EMITTING DISPLAY DEVICE INCLUDING STRUCTURE FOR REDUCING REFLECTION

CROSS-REFERENCE TO RELATED APPLICATION

This application claims priority under 35 U.S.C. § 119 to Korean Patent Application No. 10-2017-0162951, filed on Nov. 30, 2017, in the Korean Intellectual Property Office (KIPO), the disclosure of which is incorporated by reference herein in its entirety.

TECHNICAL FIELD

Exemplary embodiments of the present invention relate to a display device, and more particularly, to a light emitting display device having a structure for reducing the reflection of light.

DISCUSSION OF RELATED ART

Flat panel display (FPD) devices have a reduced weight and volume as compared to cathode ray tubes (CRT). Examples of FPD devices include liquid crystal display (LCD) devices, field emission display (FED) devices, plasma display panel (PDP), devices, and light emitting display devices.

The light emitting display devices display images using an organic light emitting diode ("OLED") which generates light by recombining electrons and holes.

The light emitting display device includes a large number of metal patterns disposed therein. Most of these metal patterns have high reflectance. Accordingly, external light that is incident into the inside of the light emitting display device may be reflected by the metal pattern and light so-reflected may be emitted back through the light emitting display device. Such reflection of external light may negatively impact display quality and may contribute to a shifting of colors when changing viewing angle.

For example, when black is displayed on the screen of the light emitting display device, a reflection color unevenness phenomenon may occur in which the color tone of the screen is distorted into purple, blue or green depending on the external light source and the viewing angle of the user.

SUMMARY

A display device includes a substrate and a switching element disposed on the substrate. A pixel electrode is disposed on the substrate and is connected to the switching element. A pixel defining layer is disposed on the pixel electrode. The pixel defining layer defines a pixel area of the substrate. A light emitting layer is disposed on the pixel electrode. A common electrode is disposed on the light emitting layer and the pixel defining layer. A sealing layer is disposed on the common electrode. A first light blocking layer is disposed between the pixel defining layer and the sealing layer.

A display device includes a substrate and a driving circuit disposed on the substrate. A pixel defining layer is disposed on the driving circuit. The pixel defining layer has a first opening at least partially overlapping a pixel area of the substrate. A light emitting element is disposed over the driving circuit within the pixel area. A first light blocking layer is disposed over the pixel defining layer. The first light blocking layer has a second opening at least partially overlapping the pixel area of the substrate. A sealing layer is disposed over the first light blocking layer and the light emitting element. A second light blocking layer is disposed over the sealing layer. The second light blocking layer has a third opening at least partially overlapping the pixel area of the substrate.

BRIEF DESCRIPTION OF THE DRAWINGS

A more complete appreciation of the present invention will become more apparent by describing in detail exemplary embodiments thereof with reference to the accompanying drawings, wherein.

DETAILED DESCRIPTION

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

In the drawings, thicknesses of a plurality of layers and areas may be illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Further when a layer, area, or plate is referred to as being "below" another layer, area, or plate, it may be directly below the other layer, area, or plate, or intervening layers, areas, or plates may be present therebetween.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

Hereinafter, a light emitting display device according to exemplary embodiments of the present invention will be described in detail with reference to FIGS. 1 to 6.

Figure 1:
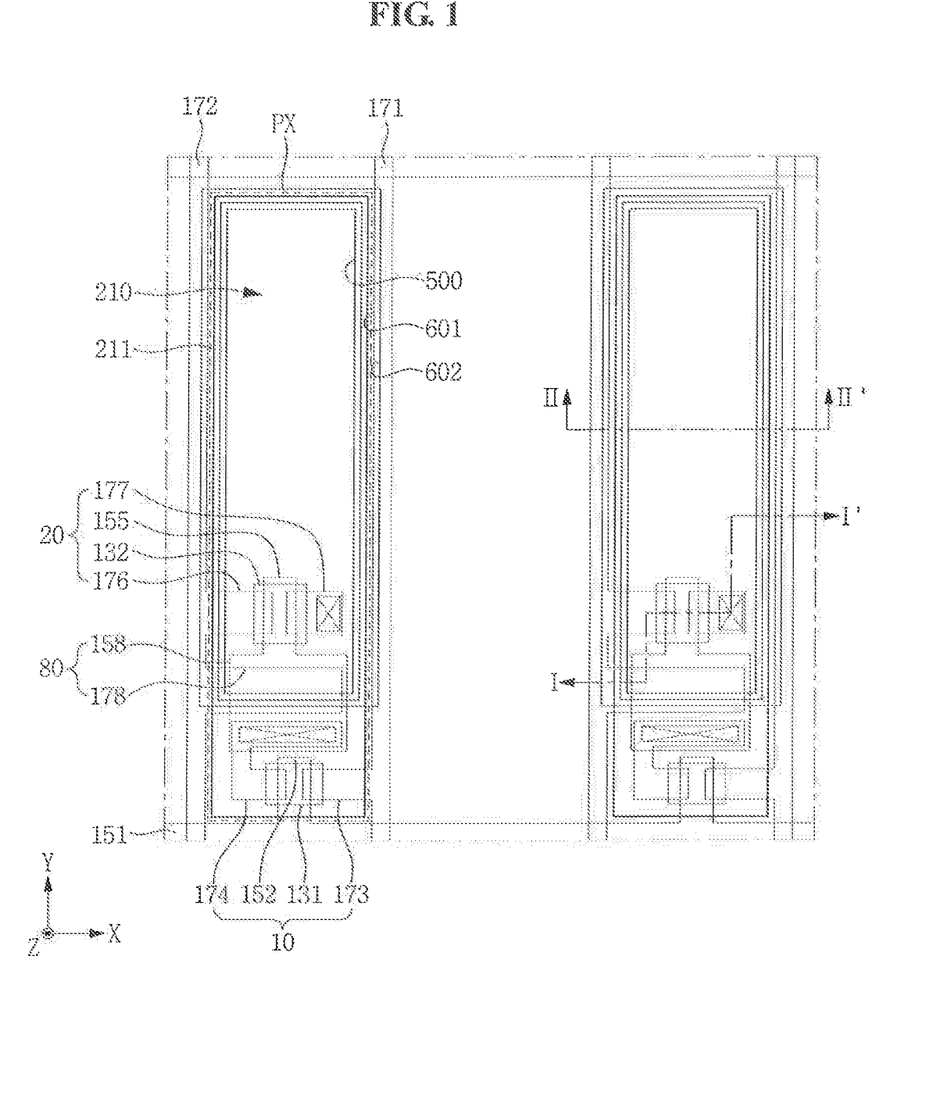
FIG. 1 is a plan view illustrating a light emitting display device according to an exemplary embodiment of the present invention.
Figure 2:
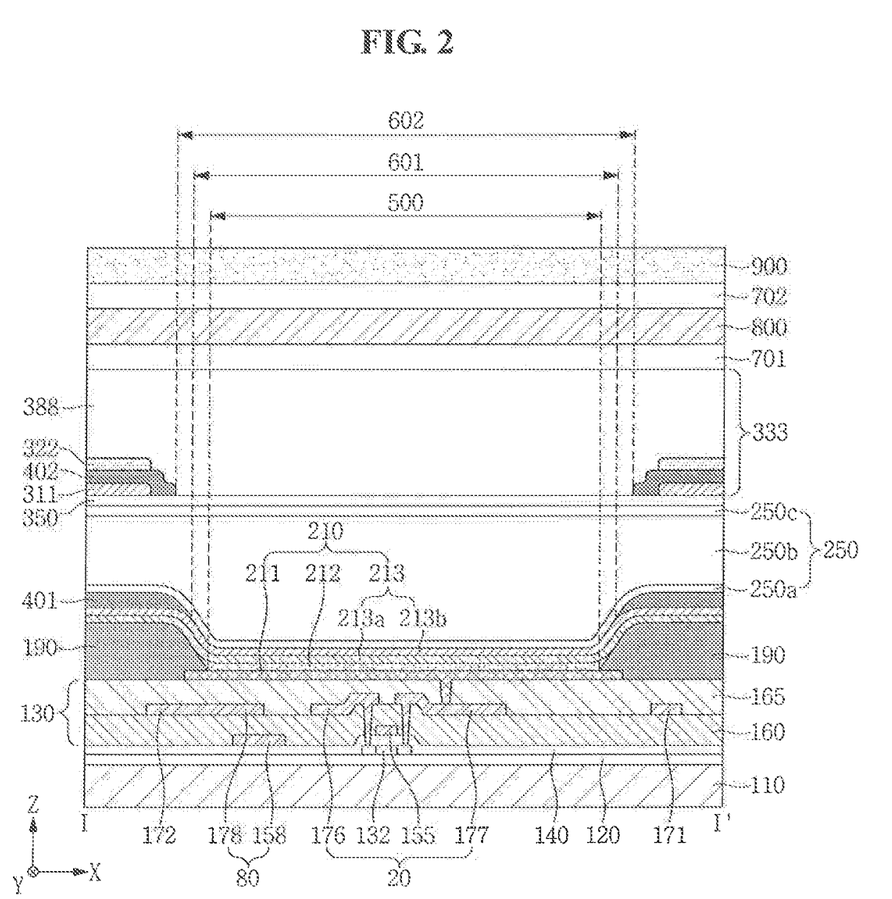
FIG. 2 is a cross-sectional view taken along line I-I' of FIG. 1.
Figure 3:
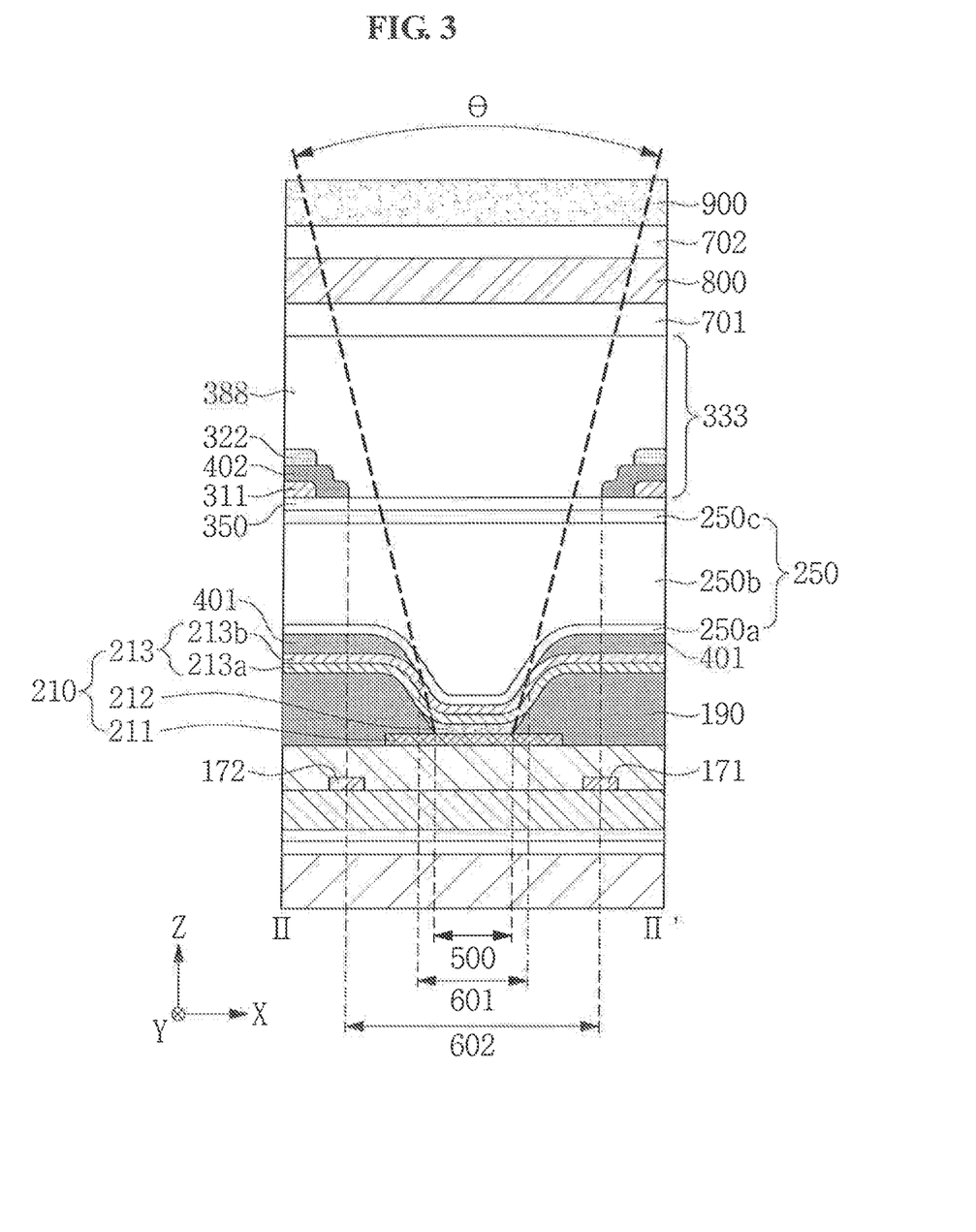
FIG. 3 is a cross-sectional view taken along line II-II' of FIG. 1.

FIG. 1 is a plan view illustrating a light emitting display device according to an exemplary embodiment of the present invention, FIG. 2 is a cross-sectional view taken along line I-I' of FIG. 1, and FIG. 3 is a cross-sectional view taken along line II-II' of FIG. 1.

As illustrated in FIGS. 1, 2, and 3, a light emitting display device according to an exemplary embodiment of the present invention includes a substrate 110, a driving circuit unit 130, a light emitting element 210, a sealing layer 250, a touch sensor unit 333, a first adhesive 701, a polarizer 800, a second adhesive 702, and a window 900.

The light emitting display device, according to an exemplary embodiment of the present invention, includes a plurality of pixels PX. Two neighboring pixels PX are shown in FIG. 1 by way of example, however, it is to be understood that there may be any number of pixels PX within the light emitting display device. These pixels PX are arranged along an X-axis direction.

Each pixel PX may include a switching thin film transistor 10, a driving thin film transistor 20, a capacitor 80, and a light emitting element 210. For example, each pixel PX may include two thin film transistors (the switching thin film transistor 10 and the driving thin film transistor 20), one capacitor 80, and one light emitting element 210. Herein, the light emitting element 210 may be an organic light emitting diode ("OLED").

According to an exemplary embodiment of the present disclosure, the number of thin film transistors included in one pixel PX, the connection relationship between the thin film transistors, and the number of capacitors may vary depending on the structure of the pixel PX.

The substrate 110 may be a transparent insulating substrate 110 including a glass or transparent plastic. For example, the substrate 110 may include kapton, polyethersulphone (PES), polycarbonate (PC), polyimide (PI), polyethyleneterephthalate (PET), polyethylene naphthalate (PEN), polyacrylate (PAR), fiber reinforced plastic (FRP), and/or the like.

A first buffer layer 120 may be disposed on the substrate 110. The first buffer layer 120 may reduce or substantially prevent permeation of undesirable elements, may planarize a surface of the substrate, and may include suitable materials for planarizing and/or substantially preventing permeation. For example, the first buffer layer 120 may include a silicon nitride ($SiN_x$) layer, a silicon oxide ($SiO_2$) layer and/or a silicon oxynitride ($SiO_xN_y$) layer. However, the first buffer layer 120 may be omitted depending on the composition of the substrate 110 and process conditions thereof.

The driving circuit unit 130 is disposed on the substrate 110. According to an exemplary embodiment of the present disclosure, when the aforementioned first buffer layer 120 is further provided, the substrate 110 may be disposed on the first buffer layer 120.

The driving circuit unit 130 includes a gate line 151, a gate insulating layer 140, a data line 171, a common power line 172, an insulating interlayer 160, a switching thin film transistor 10, a driving thin film transistor 20, a capacitor 80 and a planarization layer 165.

Although an example of the driving circuit unit 130 is shown in FIG. 2, exemplary embodiments are not limited to the structure shown in FIG. 2. The driving circuit unit 130 may be formed into various structures.

Although the driving circuit unit 130 is depicted in FIGS. 1 and 2 as including two thin film transistors and one capacitor, exemplary embodiments are not limited thereto. According to an exemplary embodiment of the present disclosure, the driving circuit unit 130 may include three or more thin film transistors, two or more capacitors, and may have various structures including additional signal lines.

A switching semiconductor layer 131 and a driving semiconductor layer 132 are disposed on the first buffer layer 120. The switching semiconductor layer 131 and the driving semiconductor layer 132 may each include a polycrystalline silicon layer, an amorphous silicon layer and/or an oxide semiconductor such as indium gallium zinc oxide (IGZO) and/or indium zinc tin oxide (IZTO). For example, when the driving semiconductor layer 132 includes a polycrystalline silicon layer, the driving semiconductor layer 132 includes a channel area which is not doped with impurities and p+ doped source and drain areas which are formed on opposite sides of the channel area. In such an exemplary embodiment, p-type impurities, such as boron B, may be used as dopant ions, for example, $B_2H_6$ may be used. The types of impurities used may vary depending on the kinds of thin film transistors.

The driving thin film transistor 20, according to an exemplary embodiment of the present invention, may employ a p-channel metal oxide semiconductor (PMOS) thin film transistor including p-type impurities, but exemplary embodiments are not limited thereto. Alternatively, the driving thin film transistor 20 may employ an n-channel metal oxide semiconductor (NMOS) thin film transistor or a complementary metal oxide semiconductor (CMOS) thin film transistor.

The gate insulating layer 140 is disposed on both the switching semiconductor layer 131 and the driving semiconductor layer 132. The gate insulating layer 140 may include tetraethylorthosilicate (TEOS), silicon nitride ($SiN_x$) and/or silicon oxide ($SiO_2$). For example, the gate insulating layer 140 may have a double-layer structure in which a $SiN_x$ layer having a thickness of about 40 nm and a TEOS layer having a thickness of about 80 nm are sequentially stacked.

The gate line 151, a switching gate electrode 152, a driving gate electrode 155, and a first capacitor plate 158 are disposed on the gate insulating layer 140.

The switching gate electrode 152 overlaps at least a part of the switching semiconductor layer 131. For example, the switching gate electrode 152 is disposed on the gate insulating layer 140 so as to overlap a channel area of the switching semiconductor layer 131. The switching gate electrode 152 extends from the gate line 151 primarily along a Y-axis direction. The switching gate electrode 152 may be formed as a single unit with the gate line 151.

The driving gate electrode 155 overlaps at least a part of the driving semiconductor layer 132. For example, the driving gate electrode 155 is disposed on the gate insulating layer 140 so as to at least partially overlap a channel area of the driving semiconductor layer 132.

The switching gate electrode 152 may reduce or substantially prevent impurities from being doped into the channel area of the switching semiconductor layer 131 when the impurity is doped into a source area and a drain area of the switching semiconductor layer 131.

The driving gate electrode 155 may reduce or substantially prevent impurities from being doped into the channel area of the driving semiconductor layer 132 when the impurity is doped into a source area and a drain area of the driving semiconductor layer 132.

The switching gate electrode 152, the driving gate electrode 155, and the first capacitor plate 158 may each include a substantially same material. For example, the switching gate electrode 152, the driving gate electrode 155, and the first capacitor plate 158 may each include molybdenum (Mo), chromium (Cr), and/or tungsten (W).

The insulating interlayer 160 is disposed on each of the switching gate electrode 152, the driving gate electrode 155, the first capacitor plate 158, and the gate insulating layer 140. The insulating interlayer 160, similar to the gate insulating layer 140, may include or be otherwise formed of silicon nitride (SiNx), silicon oxide (SiOx), tetraethoxysilane (TEOS), and/or the like, but exemplary embodiments are not limited thereto.

The data line 171, a switching source electrode 173, a driving source electrode 176, a switching drain electrode 174, a driving drain electrode 177, the common power line 172, and a second capacitor plate 178 are each disposed on the insulating interlayer 160.

The switching source electrode 173 is connected to the source area of the switching semiconductor layer 131 through a first source contact hole which passes through the gate insulating layer 140 and the insulating interlayer 160, and the switching drain electrode 174 is connected to the drain area of the switching semiconductor layer 131 through a first drain contact hole which passes through the gate insulating layer 140 and the insulating interlayer 160.

The driving source electrode 176 is connected to the source area of the driving semiconductor layer 132 through a second source contact hole which passes through the gate insulating layer 140 and the insulating interlayer 160, and the driving drain electrode 177 is connected to the drain area of the driving semiconductor layer 132 through a second drain contact hole which passes through the gate insulating layer 140 and the insulating interlayer 160.

The configuration of the switching thin film transistor 10 and the driving thin film transistor 20 is not limited to the above-described example, and can be variously modified.

The capacitor 80 includes the first capacitor plate 158 and the second capacitor plate 178.

The switching thin film transistor 10 is turned on by a gate voltage, which is applied to the gate line 151, to transmit a data voltage, which is applied to the data line 171, to the driving thin film transistor 20. The switching thin film transistor 10 includes the switching semiconductor layer 131, the switching gate electrode 152, the switching source electrode 173, and the switching drain electrode 174. The switching gate electrode 152 is connected to the gate line 151, the switching source electrode 173 is connected to the data line 171, and the switching drain electrode 174 is connected to the first capacitor plate 158.

The driving thin film transistor 20 applies, to a pixel electrode 211, a driving power which causes a light emitting layer 212 of a light emitting element 210 in a selected pixel to emit light. The driving thin film transistor 20 includes the driving semiconductor layer 132, the driving gate electrode 155, the driving source electrode 176, and the driving drain electrode 177. The driving gate electrode 155 is connected to the first capacitor plate 158, and each of the driving source electrode 176 and the second capacitor plate 178 is connected to the common power line 172. The driving drain electrode 177 is connected to the pixel electrode 211 of the light emitting element 210 through a contact hole.

A voltage equivalent to a difference between a common voltage, which is applied to the driving thin film transistor 20 from the common power line 172, and the data voltage, which is transmitted from the switching thin film transistor 10, is stored in the capacitor 80. A current corresponding to the voltage stored in the capacitor 80 flows to the light emitting element 210 through the driving thin film transistor 20, such that the light emitting layer 212 may emit light.

The planarization layer 165 is disposed on the data line 171, the common power line 172, the switching source electrode 173, the driving source electrode 176, the switching drain electrode 174, the driving drain electrode 177, the second capacitor plate 178, and the insulating interlayer 160.

The planarization layer 165 serves to substantially eliminate a step difference of a structure therebelow and planarize a surface therebelow so as to increase luminous efficiency of the light emitting element 210 to be formed thereon. The planarization layer 165 may include a polyacrylate resin, an epoxy resin, a phenolic resin, a polyamide resin, a polyimide resin, an unsaturated polyester resin, a polyphenylene ether resin, a polyphenylene sulfide resin and/or benzocyclobutene (BCB).

The light emitting element 210 is disposed on the planarization layer 165. The light emitting element 210 may include the pixel electrode 211, the light emitting layer 212, and the common electrode 213.

The pixel electrode 211 is disposed on the planarization layer 165. The pixel electrode 211 is connected to the driving drain electrode 177 through a contact hole of the planarization layer 165.

The pixel electrode 211 may be formed as a transmissive electrode, a transflective electrode, and/or a reflective electrode.

A transparent conductive oxide ("TCO") may be used to form a transmissive electrode. Such TCO may include indium tin oxide (ITO), indium zinc oxide (IZO), antimony tin oxide (ATO), aluminum zinc oxide (AZO), zinc oxide (ZnO), and/or mixtures thereof.

A metal, e.g., magnesium (Mg), silver (Ag), gold (Au), calcium (Ca), lithium (Li), chromium (Cr), aluminum (Al) and/or copper (Cu), or an alloy thereof may be used to form a transflective electrode and a reflective electrode. In such an exemplary embodiment, whether an electrode is a transflective type or a reflective type may depend on the thickness of the electrode. The transflective electrode may have a thickness of about 200 nm or less and the reflective electrode may have a thickness of about 300 nm or more. As the thickness of the transflective electrode decreases, light transmittance and resistance increase. As the thickness of the transflective electrode increases, light transmittance decreases.

In addition, the transflective electrode and the reflective electrode may have a multilayer structure which includes a metal layer including a metal or a metal alloy and a TCO layer stacked on the metal layer.

The pixel electrode 211 is at least partially disposed in a pixel area 500. For example, the pixel electrode 211 is disposed to correspond to the pixel area 500 which is defined by a pixel defining layer 190. The pixel area 500 corresponds to an opening of the pixel defining layer 190. As used herein, the phrase "correspond" is taken to mean that there is at least a partial overlap and/or an alignment of end points of the mentioned structures within a plan or cross section view.

The pixel defining layer 190 is disposed on a part of the pixel electrode 211 (e.g., an edge portion of the pixel electrode 211). The pixel defining layer 190 is also disposed on the planarization layer 165. The pixel defining layer 190 may include a resin such as a polyacrylate resin and a polyimide resin.

The light emitting layer 212 is disposed on the pixel electrode 211 in the pixel area 500. The light emitting layer 212 includes a low molecular organic material or a high molecular organic material. At least one of a hole injection layer HIL and a hole transport layer HTL may further be disposed between the pixel electrode 211 and the light emitting layer 212, and at least one of an electron transport layer ETL and an electron injection layer EIL may further be disposed between the light emitting layer 212 and the common electrode 213.

The common electrode 213 is disposed on the pixel defining layer 190 and the light emitting layer 212. The common electrode may include at least two vertically stacked layers. For example, the common electrode 213 may include a first layer 213a and a second layer 213b on the first layer 213a.

The first layer 213a is disposed on the light emitting layer 212 and the pixel defining layer 190. The first layer 213a may include a material substantially the same as a material included in the aforementioned pixel electrode 211.

The second layer 213b is disposed on the first layer 213a. The second layer 213b includes a material having characteristics of high transmission and low reflection. For example, the second layer 213b may include titanium oxide (TiOx) and/or manganese (Mn). As used herein, the phrase "high transmission" means that at least a certain percentage of light is transmitted and the phrase "low reflection" means that no more than the certain percentage of light is reflected. This percentage may be, for example, 50%, 40%, 30%, 20%, 10%, 5%, 2%, 1% or less than 1%. Alternatively, a different percentage may be used, as will be described below.

A first light blocking layer 401 substantially minimizes reflected light in an area (a non-pixel area, e.g., an area except the pixel area 500) that is covered by the pixel defining layer 190. To this end, the first light blocking layer 401 may be disposed between the pixel defining layer 190 and the sealing layer 250. As a specific example, at the non-pixel area, the first light blocking layer 401 may be disposed between the common electrode 213 and the sealing layer 250. When the common electrode 213 includes the first layer 213a and the second layer 213b as described above, the first light blocking layer 401 is disposed on the second layer 213b. According to an exemplary embodiment of the present invention, the first light blocking layer 401 may directly contact the second layer 213b.

Since the first light blocking layer 401 is disposed between the common electrode 213 and the sealing layer 250, a vertical distance (a distance in a Z-axis direction) between the first light blocking layer 401 and the pixel area 500 may be relatively reduced. Accordingly, a viewing angle and a luminance rate of the light emitting display device may be increased. Accordingly, the first light blocking layer 401 may reduce or substantially minimize reflected light of the light emitting display device and may also increase the viewing angle and the luminance rate thereof.

As illustrated in FIGS. 1 and 2, the first light blocking layer 401 has an opening 601 (hereinafter, referred to as a first opening 601) which at least partially overlaps the pixel area 500. The first light blocking layer 401 may be located over an entire surface of the substrate so as to cover all the area except the first opening 601.

As illustrated in FIGS. 1 to 3, the first opening 601 may be larger than the pixel area 500. In a planar view as shown in FIG. 1, the first opening 601 surrounds the pixel area 500. For example, the pixel area 500 is located in the first opening 601.

As the first light blocking layer 401 is disposed between the common electrode 213 and the sealing layer 250 as described above, a vertical distance between the first light blocking layer 401 and the pixel area 500 may be relatively reduced, which means that the viewing angle may be stably ensured although the size of the first opening 601 is reduced. For example, since the vertical distance between the first light blocking layer 401 and the pixel area 500 is relatively small, the viewing angle is hardly reduced although the first light blocking layer 401 extends further in the X-axis direction toward the pixel area 500. According to an exemplary embodiment of the present disclosure, when a width of the first light blocking layer 401 increases, the reflected light may be further suppressed in the non-pixel area. Accordingly, the first light blocking layer 401 may substantially minimize the reflected light of the light emitting display device and may also increase the viewing angle and the luminance rate thereof.

A reflectance in the non-pixel area of the light emitting display device, according to an exemplary embodiment of the present invention, may be less than or substantially equal to about 4.47%. In addition, a viewing angle θ of the light emitting display device, according to an exemplary embodiment of the present invention may, be in a range from about 45 degrees to about 60 degrees.

The sealing layer 250 is disposed on the common electrode 213. For example, a transparent insulating substrate including a glass or transparent plastic may be used as the sealing layer 250. In addition, the sealing layer 250 may have a thin film encapsulation structure in which one or more inorganic layers and one or more organic layers are alternately laminated. For example, as illustrated in FIG. 2, the sealing layer 250 may include a first inorganic layer 250a, an organic layer 250b on the first inorganic layer 250a, and a second inorganic layer 250c on the organic layer 250b.

A second buffer layer 350 is disposed on the sealing layer 250. For example, the second buffer layer 350 is disposed on the second inorganic layer 250c of the sealing layer 250.

The touch sensor unit 333 is disposed on the second buffer layer 350. The touch sensor unit 333 includes the first electrode 311, a second light blocking layer 402, a second electrode 322, and an organic layer 388.

The first electrode 311 is disposed on the second buffer layer 350. For example, the first electrode 311 is disposed on the second buffer layer 350 at the non-pixel area.

The second light blocking layer 402 substantially minimizes the reflected light at the non-pixel area. The second light blocking layer 402 is disposed on the first electrode 311 and the second buffer layer 350. For example, the second light blocking layer 402 is disposed on the first electrode 311 and the second buffer layer 350 at the non-pixel area.

The second light blocking layer 402 has an opening 602 (hereinafter, referred to as a second opening 602) which at least partially overlaps the pixel area 500. The second light blocking layer 402 may be disposed over an entire surface of the substrate 110 so as to cover the entire area except the second opening 602.

As shown in FIGS. 1 to 3, the second opening 602 may be larger than the pixel area 500. In a planar view, as shown in FIG. 1, the second opening 602 at least partially surrounds the pixel area 500. For example, the pixel area 500 is located within the second opening 602.

In addition, the second opening 602 may be larger than the first opening 601. In a planar view, as shown in FIG. 2, the second opening 602 at least partially surrounds the first opening 601. For example, the first opening 601 is located within the second opening 602.

According to an exemplary embodiment of the present disclosure, the second light blocking layer 402 may be omitted.

The second electrode 322 is disposed on the second light blocking layer 402. For example, the second electrode 322 is disposed on the second light blocking layer 402 at the non-pixel area. Although not illustrated, the second electrode 322 includes a plurality of first touch electrodes and a plurality of second touch electrodes. According to an exemplary embodiment of the present disclosure, the first touch electrodes may be connected to the first electrode 311 through a contact hole of the second light blocking layer 402. For example, the aforementioned first electrode 311 may be a connection electrode connecting the first touch electrodes.

The organic layer 388 is disposed on the second light blocking layer 402 and the second buffer layer 350.

The first adhesive 701 is disposed on the organic layer.

The polarizer 800 is disposed on the first adhesive 701. The first adhesive 701 is disposed between the organic layer 388 and the polarizer 800 and may attach the organic layer 388 to the polarizer 800. The polarizer 800 transmits light incident from the outside and may substantially prevent the incident light from being emitting back to the outside by reflection. For example, the light incident from the outside into the light emitting display device through the polarizer 800 may be reflected by a metal pattern (e.g., the data line 171) to be directed toward the polarizer 800 again, and the polarizer 800 may reduce or substantially prevent the reflected light from being emitted to the outside. The polarizer 800 may reduce or substantially prevent degradation of the visibility of the light emitting display device due to external light reflection.

The second adhesive 702 is disposed on the polarizer 800.

The window 900 is disposed on the second adhesive 702. The second adhesive 702 is disposed between the polarizer 800 and the window 900 to attach the polarizer 800 and the window 900 to each other.

According to an exemplary embodiment of the present disclosure, the pixel PX may have a double-sided emission type structure in which light may be emitted primarily in the direction of the pixel electrode 211 and the common electrode 213. According to an exemplary embodiment of the present disclosure, both the pixel electrode 211 and the common electrode 213 may be formed as a transmissive or transflective electrode.

Figure 4:
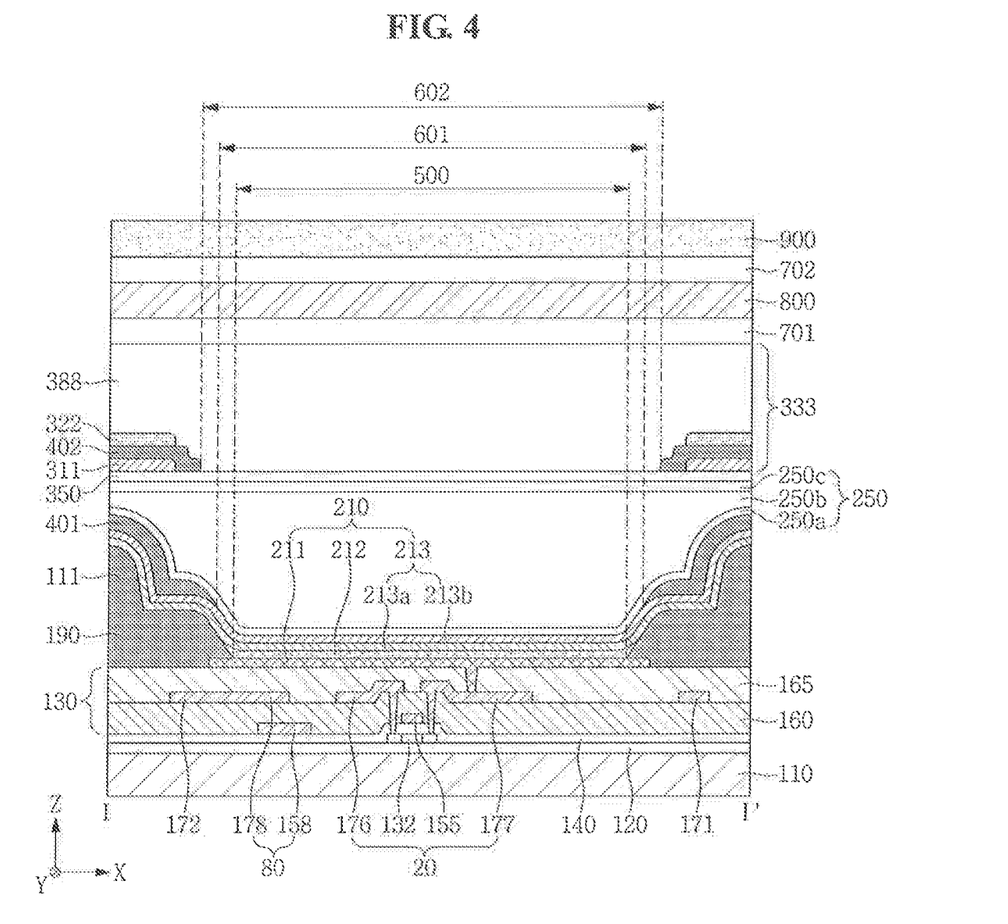
FIG. 4 is a cross-sectional view taken along line I-I' of FIG. 1 according to an exemplary embodiment of the present invention.
Figure 5:
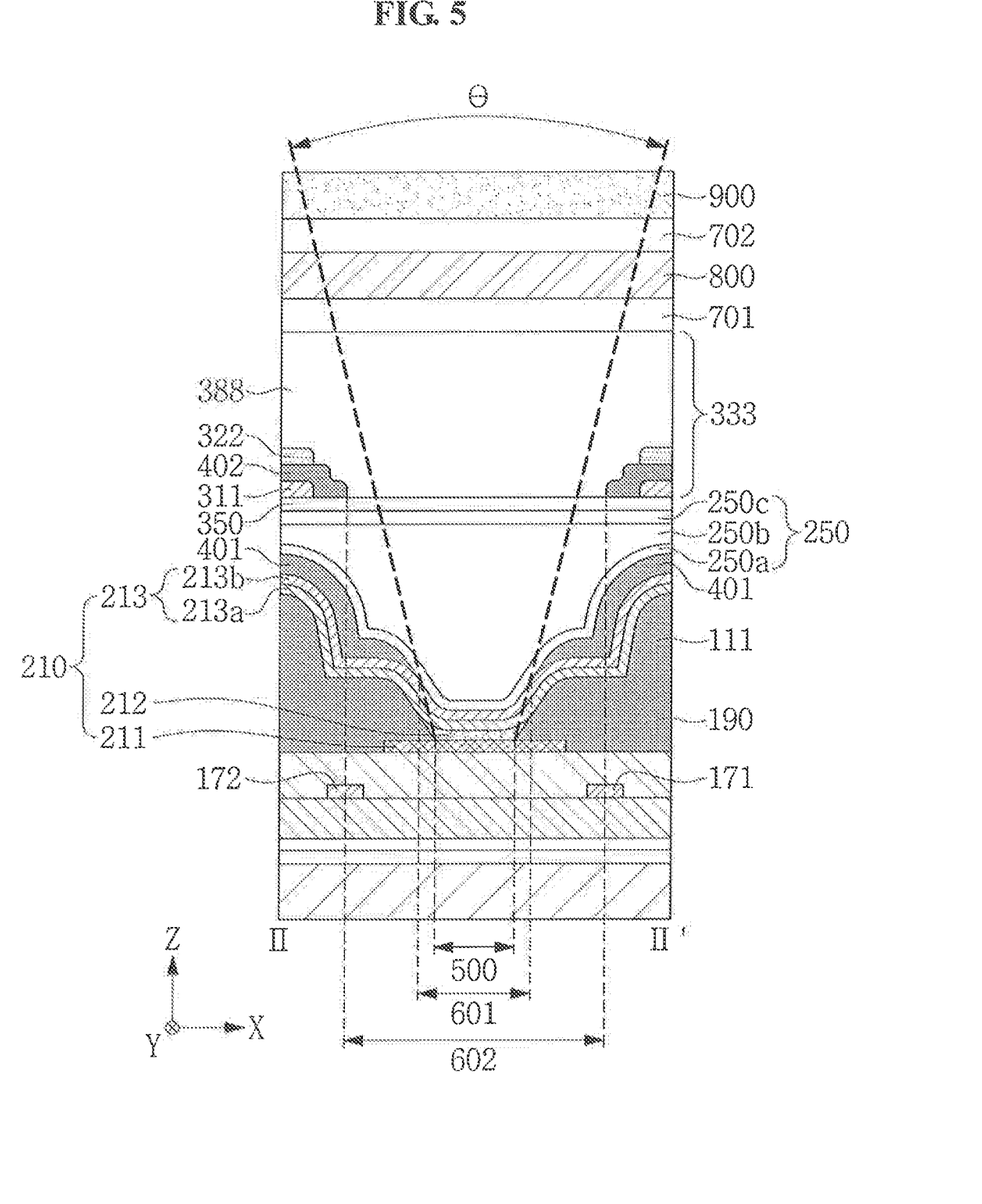
FIG. 5 is a cross-sectional view taken along line II-II' of FIG. 1 according to an exemplary embodiment of the present invention.

FIG. 4 is a cross-sectional view taken along line I-I' of FIG. 1 according to an exemplary embodiment of the present invention, and FIG. 5 is a cross-sectional view taken along line II-II' of FIG. 1 according to an exemplary embodiment of the present invention.

A light emitting display device according to an exemplary embodiment of the present invention may further include a spacer 111, as illustrated in FIGS. 4 and 5.

The spacer 111 is disposed on a pixel defining layer 190. For example, the spacer is disposed on the pixel defining layer 190 at a non-pixel area thereof. The spacer 111 may include a material substantially the same as a material included in the pixel defining layer 190. The spacer 111 may substantially minimize a step difference between a layer located at a display area of a substrate 110 and a layer located at a non-display area of the substrate 110. The spacer 111 may be disposed so as to correspond to a first electrode 311.

When the light emitting display device according to an exemplary embodiment of the present invention includes the spacer 111, the common electrode 213, the first light blocking layer 401, and the sealing layer 250 described above may be disposed on the spacer 111.

Figure 6:
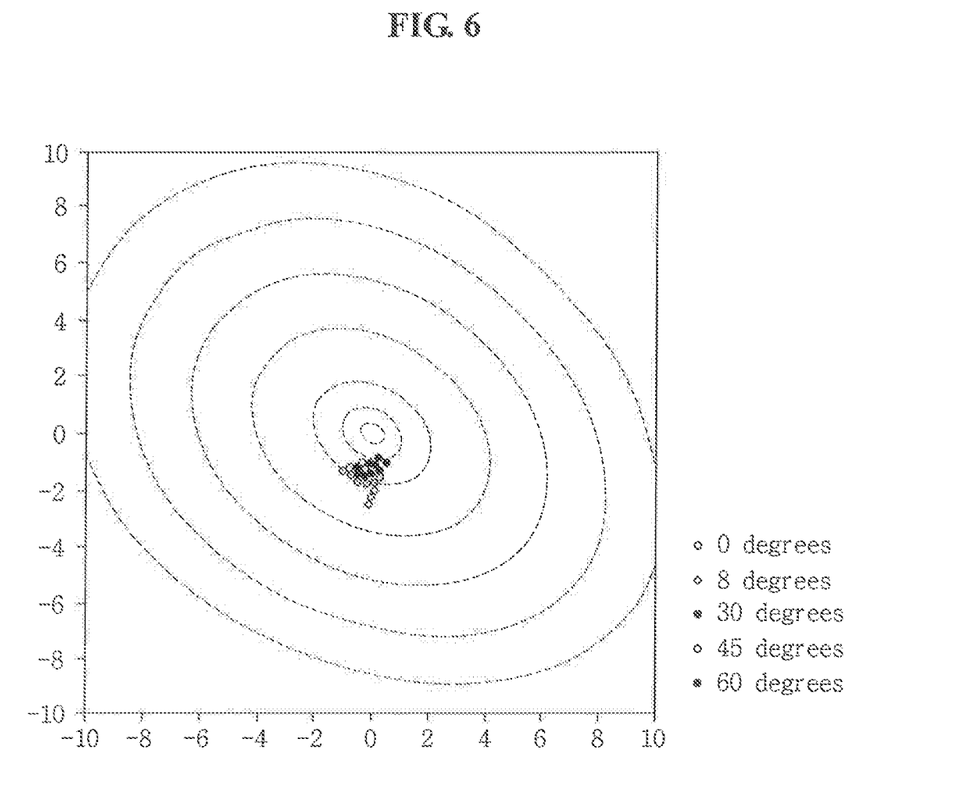
FIG. 6 is a view showing color coordinates for explaining a reflection color tone corresponding to each azimuth angle of the display device according to an exemplary embodiment of the present invention.

FIG. 6 is a view showing color coordinates for explaining a reflection color tone corresponding to each azimuth angle of the display device according to an exemplary embodiment of the present invention.

An X-axis in FIG. 6 represents an X color coordinate, and a Y-axis in FIG. 6 represents a Y color coordinate.

Referring to FIG. 6, it may be appreciated that the distribution of color coordinates is at least partially concentrated at one area, when a viewing angle (or an inclination angle) is about 0 degrees, 8 degrees, 30 degrees, 45 degrees and 60 degrees. Accordingly, the light emitting display device, according to exemplary embodiments of the present invention, provides a uniform reflection color tone irrespective of the viewing angle. For example, when black is displayed on the screen of the light emitting display, it may be perceived as a uniform black color regardless of the viewing angle.

As set forth hereinabove, according to one or more exemplary embodiments of the present disclosure, the light emitting display device may provide a uniform reflection color tone irrespective of the viewing angle.

While the present invention has been illustrated and described with reference to the exemplary embodiments thereof, it will be apparent to those of ordinary skill in the art that various changes in form and detail may be made thereto without departing from the spirit and scope of the present invention.

What is claimed is:

1. A display device comprising:
   a substrate;
   a switching element disposed on the substrate;
   a pixel electrode disposed on the substrate and connected to the switching element;
   a pixel defining layer disposed on the pixel electrode, the pixel defining layer defining a pixel area of the substrate;
   a light emitting layer disposed on the pixel electrode;
   a common electrode disposed on the light emitting layer and the pixel defining layer;
   a sealing layer disposed on the common electrode;
   a first light blocking layer disposed between the common electrode and the sealing layer; and
   a second light blocking layer disposed on the sealing layer at a non-pixel area of the substrate that is exclusive with respect to the pixel area,
   wherein the first light blocking layer directly contacts the common electrode,
   wherein each of the first light blocking layer and the second light blocking layer has an opening which at least partially overlaps the pixel area,
   wherein the opening of the first light blocking layer is larger than the pixel area, and
   wherein the opening of the second light blocking layer is larger than the opening of the first light blocking layer.

2. The display device of claim 1, Wherein the common electrode comprises:
   a first layer disposed on the light emitting layer and the pixel defining layer; and
   a second layer disposed on the first layer, the second layer comprising a material having characteristics of high transmittance and low reflection.

3. The display device of claim 2, wherein the first light blocking layer directly contacts the second layer.

4. The display device of claim 1, wherein the first light blocking layer includes an opening which at least partially overlaps the pixel area, and
   wherein the opening of the first light blocking layer is larger than the pixel area.

5. The display device of claim 4, wherein the pixel area is at least partially surrounded by the opening of the first light blocking layer.

6. The display device of claim 1, wherein the pixel area and the opening of the first light blocking layer are each at least partially surrounded by the opening of the second light blocking layer.

7. The display device of claim 1, further comprising an organic layer disposed on the second light blocking layer and the sealing layer.

8. The display device of claim 7, further comprising a buffer layer disposed between the sealing layer and the organic layer and between the sealing layer and the second light blocking layer.

9. The display device of claim 7, further comprising a polarizer disposed on the organic layer.

10. The display device of claim 9, further comprising a first adhesive disposed between the organic layer and the polarizer.

11. The display device of claim 9, further comprising a window disposed on the polarizer.

12. The display device of claim 11, further comprising a second adhesive disposed between the polarizer and the window.

13. The display device of claim 1, further comprising a spacer disposed between the pixel defining layer and the common electrode.

14. The display device of claim 13, wherein the spacer and the pixel defining layer are part of a single unitary structure.

15. A display device comprising:
a substrate;
a switching element disposed on the substrate;
a pixel electrode disposed on the substrate and connected to the switching element;
a pixel defining layer disposed on the pixel electrode, the pixel defining layer defining a pixel area of the substrate;
a light emitting layer disposed on the pixel electrode;
a common electrode disposed on the light emitting layer and the pixel defining layer;
a sealing layer disposed on the common electrode;
a first light blocking layer disposed between the common electrode and the sealing layer;
a second light blocking layer disposed on the sealing layer at a non-pixel area of the substrate that is exclusive with respect to the pixel area; and
a first electrode disposed between the second light blocking layer and the sealing layer,
wherein the first light blocking layer directly contacts the common electrode.

16. The display device of claim 15, further comprising, at the non-pixel area, a second electrode disposed on the second light blocking layer and at least partially overlapping the first electrode.

17. A display device, comprising:
a substrate;
a driving circuit disposed on the substrate;
a pixel defining layer disposed on the driving circuit, the pixel defining layer having a first opening at least partially overlapping a pixel area of the substrate;
a light emitting element disposed over the driving circuit within the pixel area;
a first light blocking layer disposed over the pixel defining layer, the first light blocking layer having a second opening at least partially overlapping the pixel area of the substrate;
a sealing layer disposed over the first light blocking layer and the light emitting element; and
a touch sensor unit disposed on the sealing layer, the touch sensor unit comprising a second light blocking layer disposed over the sealing layer, the second light blocking layer having a third opening at least partially overlapping the pixel area of the substrate,
wherein the third opening is larger than the second opening and the second opening is larger than the first opening.

18. The display device of claim 17, wherein the first opening, the second opening, and the third opening are all concentric.

19. The display device of claim 1, wherein a distance between the first light blocking layer and the second light blocking layer is greater than a distance between the pixel defining layer and the first light blocking layer.

20. The display device of claim 17, wherein a distance between the first light blocking layer and the second light blocking layer is greater than a distance between the pixel defining layer and the first light blocking layer.

* * * * *